(12) United States Patent
Horie

(10) Patent No.: US 9,152,122 B2
(45) Date of Patent: Oct. 6, 2015

(54) STATIC-ELECTRICITY-BLOCKING MOUNTING UNIT AND ELECTRONIC APPARATUS

(75) Inventor: Takeji Horie, Kodaira (JP)

(73) Assignee: CANON FINETECH INC., Misato-Shi, Saitama-Ken (JP)

(*) Notice: Subject to any disclaimer, the term of this patent is extended or adjusted under 35 U.S.C. 154(b) by 296 days.

(21) Appl. No.: 13/482,968

(22) Filed: May 29, 2012

(65) Prior Publication Data

US 2012/0307411 A1 Dec. 6, 2012

(30) Foreign Application Priority Data

May 30, 2011 (JP) ................................. 2011-120023

(51) Int. Cl.
*G03G 21/16* (2006.01)
*H05K 9/00* (2006.01)

(52) U.S. Cl.
CPC ........ *G03G 21/1619* (2013.01); *G03G 21/1652* (2013.01); *H05K 9/0067* (2013.01)

(58) Field of Classification Search
CPC .......... G03G 21/1619; G03G 21/1652; H05K 9/0067
USPC ............................................. 361/220; 174/2
See application file for complete search history.

(56) References Cited

U.S. PATENT DOCUMENTS

| | | | | |
|---|---|---|---|---|
| 3,669,170 A | * | 6/1972 | Schuster | 411/175 |
| 4,642,727 A | * | 2/1987 | Dalal | 361/212 |
| 4,797,045 A | * | 1/1989 | Lautenschlager et al. | 411/107 |
| 4,920,449 A | * | 4/1990 | Covey | 361/216 |
| 2012/0119757 A1 | * | 5/2012 | Nakamura et al. | 324/613 |

FOREIGN PATENT DOCUMENTS

| | | |
|---|---|---|
| CN | 201054428 | 4/2008 |
| JP | 61-148907 | 9/1986 |
| JP | 63-84668 | 11/1986 |
| JP | 63-84668 | 6/1988 |
| JP | 2-49195 | 9/1988 |
| JP | 01-144813 | 10/1989 |
| JP | 02-007398 | 1/1990 |
| JP | 2-49195 | 4/1990 |
| JP | 7-043809 | 2/1995 |

(Continued)

OTHER PUBLICATIONS

Japanese Office Action dated Aug. 20, 2013 in Japanese Appl. No. 2012-122275, with English translation.

(Continued)

*Primary Examiner* — Zeev V Kitov
(74) *Attorney, Agent, or Firm* — Fitzpatrick, Cella, Harper & Scinto

(57) ABSTRACT

A static-electricity-blocking mounting unit, including: a mounting sheet metal in which a female screw portion is formed, the female screw portion being configured to threadably engage with a male screw configured to fix a member to be fixed to a housing; and an insulating member made of an insulating material and configured to support the mounting sheet metal, wherein the mounting sheet metal is fixed to the housing via the insulating member, and the member to be fixed is fixed to the housing by the male screw threadably engaging with the female screw portion of the mounting sheet metal.

7 Claims, 14 Drawing Sheets

(56) References Cited

FOREIGN PATENT DOCUMENTS

| | | | |
|---|---|---|---|
| JP | 2003-269430 | | 9/2003 |
| WO | WO2010079009 | * | 11/2009 |

OTHER PUBLICATIONS

Chinese Office Action dated Sep. 3, 2014 in counterpart Chinese Application No. 201210173045.X.

* cited by examiner

STATIC-ELECTRICITY-BLOCKING MOUNTING UNIT AND ELECTRONIC APPARATUS

BACKGROUND OF THE INVENTION

1. Field of the Invention

The present invention relates to a mounting unit to be used for mounting a cover member to a housing of an electronic apparatus, and more particularly, to a static-electricity-blocking mounting unit configured to prevent static electricity from flowing through a circuit board or the like of an electronic apparatus via a metallic screw configured to fix a cover member to a housing of the electronic apparatus.

2. Description of the Related Art

In an electronic apparatus provided with a circuit board having electronic components mounted thereto, when static electricity flows through the circuit board, the circuit board may malfunction or may be damaged. Therefore, it is one of significant challenges to prevent the static electricity from flowing through the circuit board, and various measures have been proposed conventionally against the static electricity.

It is another one of the significant challenges in the electronic apparatus to take measures against, for example, static electricity flowing via a metallic screw to be used for fixing an exterior component, such as a cover member, to a rear surface of the electronic apparatus. In particular, from the perspective of product layout, a large number of electrical components may be arranged on the rear surface of the electronic apparatus, and therefore, when the cover member configured to cover the rear surface, on which the large number of electrical components are arranged, is fixed to a housing of the electronic apparatus, a fastening position of the metallic screw needs to be taken into consideration. This is because the static electricity may flow through the circuit board via the metallic screw when the cover member is fixed in the vicinity of the circuit board with the metallic screw.

To address this, for example, the metallic screw may be coated with an insulating material having a high hardness, which can avoid the situation in which the static electricity flows through the circuit board via the screw. However, when the screw is made of such a material, manufacturing cost for the screw increases, and hence such a measure is not appropriate.

Further, for example, the fastening position of the metallic screw may be provided at a position distant from the circuit board so that the static electricity does not flow through the circuit board but flows to a ground, which can avoid the malfunction of the circuit board due to the static electricity. However, as in the above-mentioned case where a large number of electrical components are arranged on the rear surface of the housing from the perspective of product layout, the cover member may need to be fixed also in the vicinity of the circuit board with the metallic screw. To address this, there is disclosed a mounting structure for a cover member, in which a screw fastening seat for enclosing the metallic screw is formed on the housing to insulate the metallic screw (Japanese Patent Application Laid-Open No. H07-43809).

However, in the mounting structure for a cover member described in Japanese Patent Application Laid-Open No. H07-43809, the screw fastening seat is made of a resin material, and hence, when the metallic screw is fastened and unfastened repeatedly, fastening strength may decrease. To address this, for example, the seat may be made of an insulating material having a high hardness, but as described above, the manufacturing cost increases, and hence such a measure is not appropriate. Further, when the screw fastening seat is formed, there arises a problem in that change of the screw fastening position or other such flexible adaptation cannot be performed in a case of, for example, layout change of the electrical components.

Further, for example, an element for electrostatic measures may be added to the circuit board so that the circuit board does not cause malfunction even when the static electricity flows, which can avoid the malfunction of the circuit board. In this case, however, an electrostatic discharge immunity test needs to be conducted repeatedly every time the circuit is modified, with the result that efficiency decreases and cost increases.

SUMMARY OF THE INVENTION

Therefore, the present invention provides a cost-efficient static-electricity-blocking mounting unit, which is configured to endure repeated fastening and unfastening of a metallic screw and to insulate the metallic screw, and provides an electronic apparatus including the static-electricity-blocking mounting unit.

According to an exemplary embodiment of the present invention, there is provided a static-electricity-blocking mounting unit, including: a mounting sheet metal in which a female screw portion is formed, the female screw portion being configured to threadably engage with a male screw configured to fix a member to be fixed to a housing; and an insulating member made of an insulating material and configured to support the mounting sheet metal, wherein the mounting sheet metal is fixed to the housing via the insulating member, and the member to be fixed is fixed to the housing by the male screw threadably engaging with the female screw portion of the mounting sheet metal.

According to the present invention, it is possible to provide the cost-efficient static-electricity-blocking mounting unit, which is configured to endure repeated fastening and unfastening of the metallic screw and to insulate the metallic screw, and provide the electronic apparatus including the static-electricity-blocking mounting unit.

Further features of the present invention will become apparent from the following description of exemplary embodiments with reference to the attached drawings.

DESCRIPTION OF THE EMBODIMENTS

Hereinafter, an electronic apparatus including a static-electricity-blocking mounting unit according to embodiments of the present invention will be described with reference to the attached drawings. Note that, the following embodiments are described using an image forming apparatus 1 as the electronic apparatus, such as a copying machine, a printer, a facsimile machine, and a multifunction peripheral of those machines, in which a circuit board 40 having electronic components mounted thereto is disposed.

First Embodiment

Figure 1:
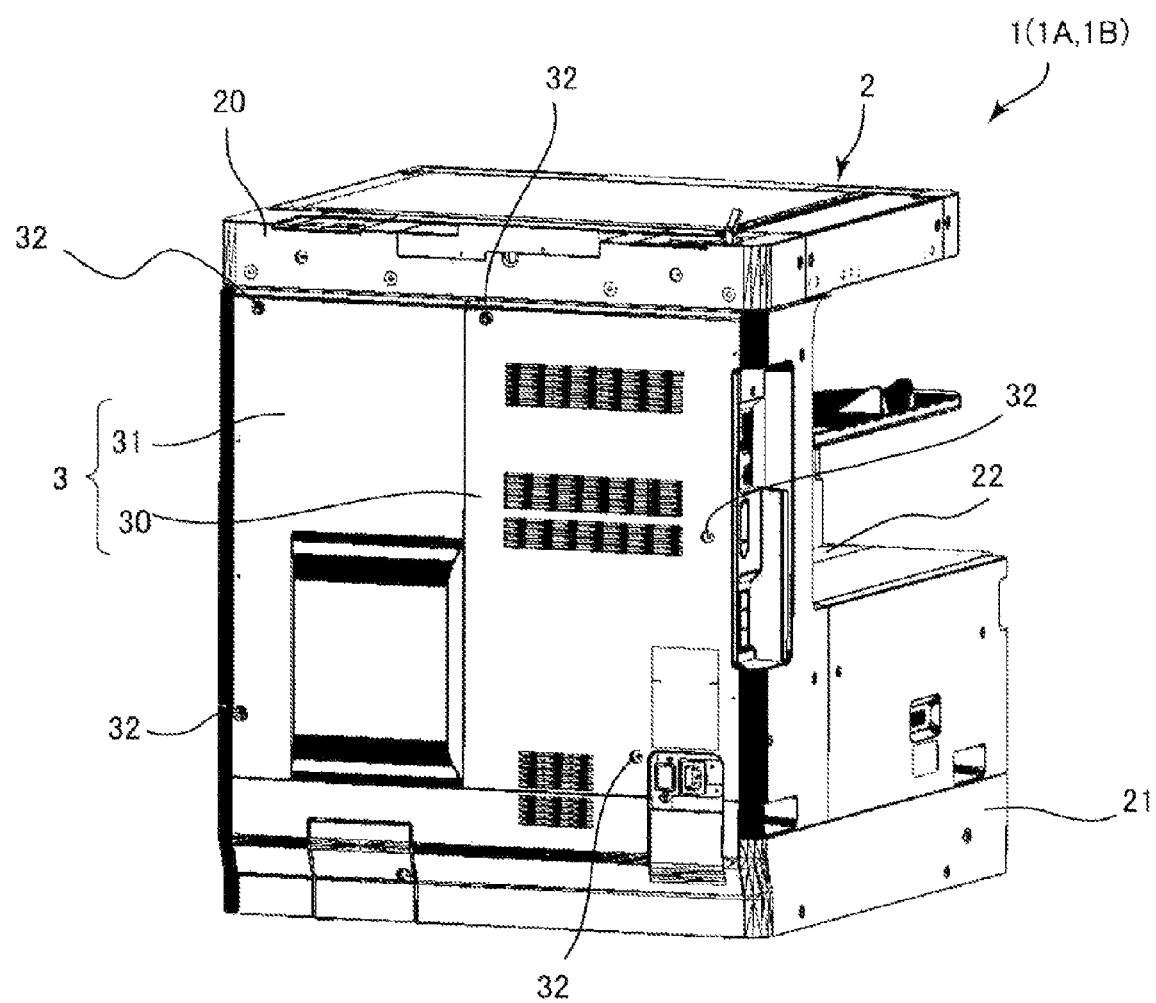
FIG. 1 is a perspective view of an image forming apparatus according to embodiments of the present invention as viewed from a rear surface side thereof.
Figure 2:
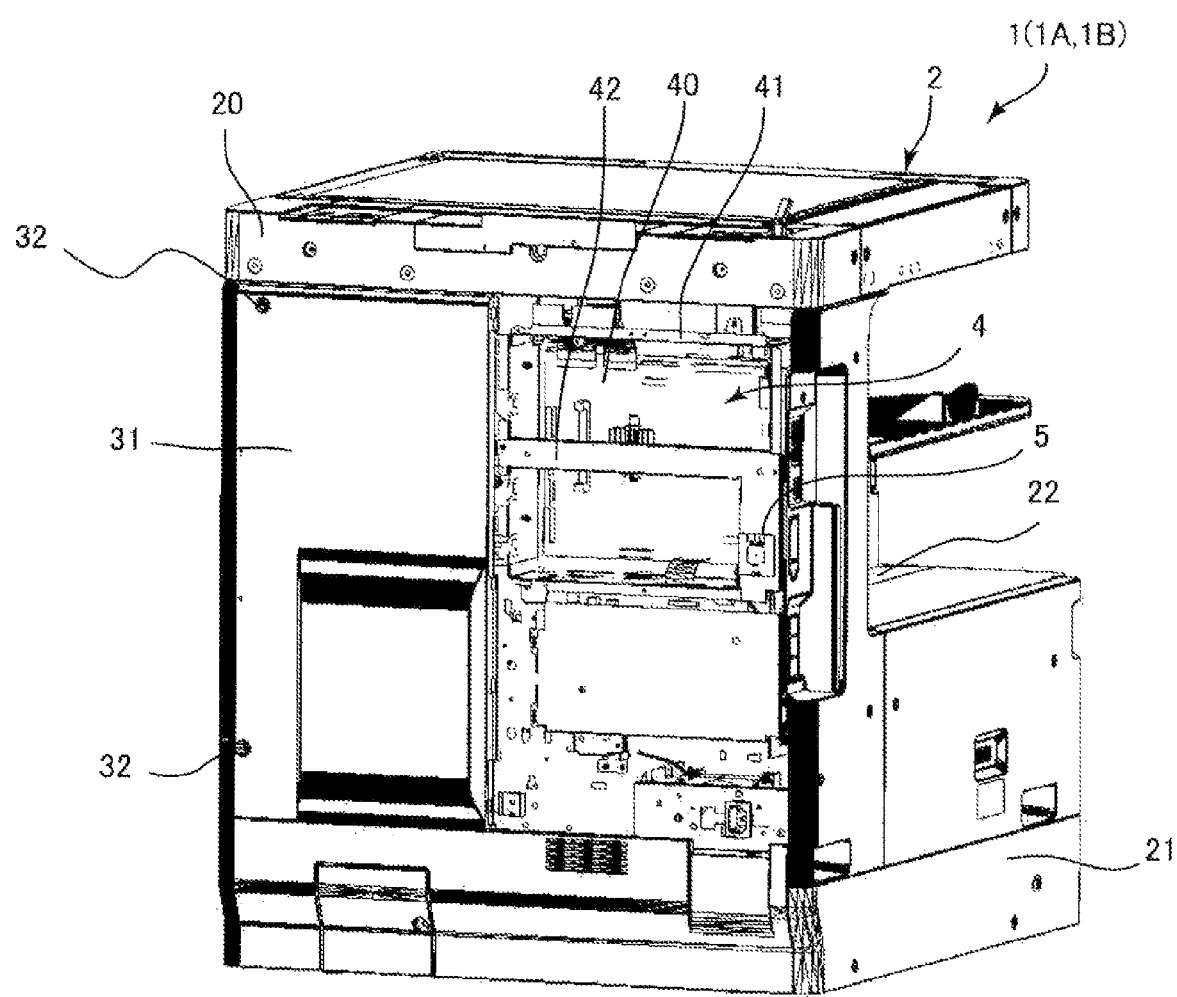
FIG. 2 is a perspective view illustrating a state in which a first rear cover of the image forming apparatus according to the embodiments of the present invention is removed.
Figure 3:
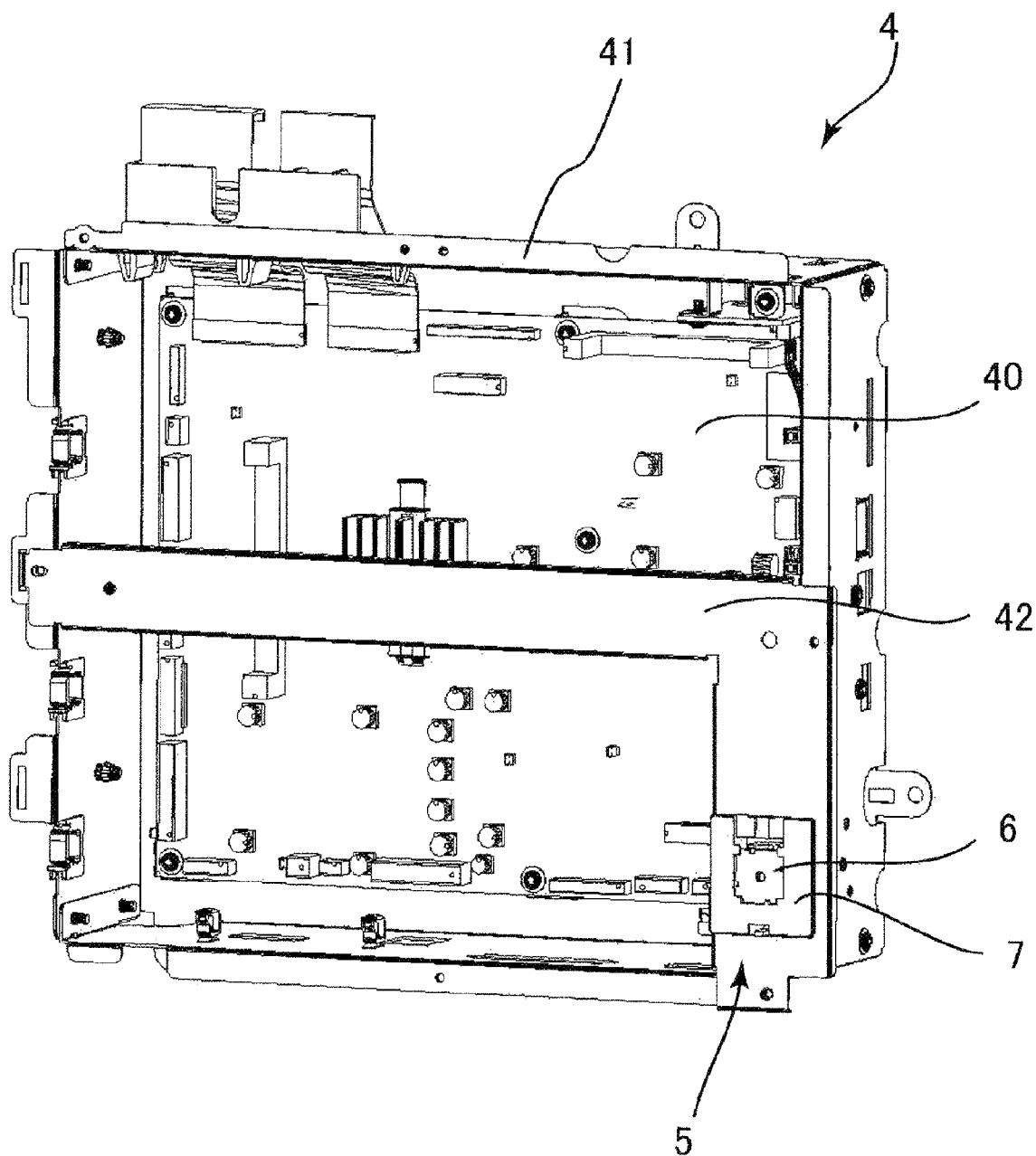
FIG. 3 is a view illustrating an electronic circuit unit mounted to the rear surface of the image forming apparatus according to the embodiments of the present invention.

The image forming apparatus 1 according to a first embodiment of the present invention will be described with reference to FIGS. 1 to 8D. First, a schematic structure of the image forming apparatus 1 according to the first embodiment will be described with reference to FIGS. 1 to 3. FIG. 1 is a perspective view of the image forming apparatus 1 according to the embodiments of the present invention as viewed from a rear surface side thereof. FIG. 2 is a perspective view illustrating a state in which a first rear cover 30 of the image forming apparatus 1 according to this embodiment is removed. FIG. 3 is a view illustrating an electronic circuit unit 4 mounted to the rear surface of the image forming apparatus 1 according to this embodiment.

As illustrated in FIGS. 1 and 2, the image forming apparatus 1 according to the first embodiment includes an image forming apparatus main body 2, a rear cover 3 as a member to be fixed, configured to cover a rear surface of the image forming apparatus main body 2, and the electronic circuit unit 4 disposed on the rear surface of the image forming apparatus main body 2.

The image forming apparatus main body 2 includes a housing 20, a sheet storing portion 21 configured to store sheets, a sheet feeding portion (not shown) configured to feed the sheet stored in the sheet storing portion 21, and an image forming portion (not shown) configured to form an image on the sheet fed by the sheet feeding portion. Further, the image forming apparatus main body 2 includes a transfer portion (not shown) configured to transfer the image formed by the image forming portion onto the sheet, a fixing portion (not shown) configured to fix the image transferred by the transfer portion, and a sheet delivery portion 22 to which the sheet is delivered.

The housing 20 houses the sheet storing portion 21, the sheet feeding portion, the image forming portion, the transfer portion, and the fixing portion. The sheet storing portion 21 includes a cassette (not shown) configured to store sheets S, and the sheets S stored in the cassette are each fed to the image forming portion by the sheet feeding portion at a predetermined timing. The image forming portion includes photosensitive drums (not shown) on which yellow, magenta, cyan, and black toner images are to be formed, and the transfer portion transfers the toner images of the respective colors, which are formed on the photosensitive drums, onto the sheet S. Accordingly, an unfixed toner image is formed on the sheet S. After that, the unfixed toner image is fixed onto the sheet by the fixing portion, and the sheet having the image fixed thereto is delivered to the sheet delivery portion 22. In this manner, image forming processing is finished.

As illustrated in FIG. 1, the rear cover 3 includes the first rear cover 30 configured to cover one side of the image forming apparatus main body 2 (right side of FIG. 1), and a second rear cover 31 configured to cover another side of the image forming apparatus main body 2 (left side of FIG. 1). Note that, this embodiment is described using the rear cover 3 divided into the first rear cover 30 and the second rear cover 31, but alternatively, the rear cover 3 may be formed of the first rear cover 30 and the second rear cover 31 integrated together.

The first rear cover 30 and the second rear cover 31 are formed so as to be mountable to the image forming apparatus main body 2, and are fixed to the housing 20 of the image forming apparatus main body 2 by exterior fixing screws 32 serving as male screws. The first rear cover 30 and the second rear cover 31 are fixed to the housing 20 of the image forming apparatus main body 2 by the exterior fixing screws 32, and accordingly prevent a hand of a user from accidentally touching the electronic circuit unit 4 disposed on the rear surface. Therefore, the first rear cover 30 and the second rear cover 31 are fixed to the housing 20 of the image forming apparatus main body 2 at several positions (in this embodiment, five positions in total) also in consideration of, for example, uplift of the first rear cover 30 and the second rear cover 31.

As illustrated in FIG. 3, the electronic circuit unit 4 includes the circuit board 40, a shield member 41, and a circuit cover 42. On the circuit board 40, electronic circuits and electrical components, such as a CPU, are mounted.

Further, the circuit board 40 is surrounded by the shield member 41 so as to suppress an effect imposed on peripheral components from noise generated by the circuit board 40. The circuit cover 42 configured to protect the circuit board 40 is mounted to the shield member 41. The circuit cover 42 is arranged so as to be opposed to the circuit board 40, and is mounted to the shield member 41 by screws or the like.

Further, the circuit cover 42 has a mounting hole (see FIG. 5 for later reference) formed therein as a predetermined fixing portion on which a static-electricity-blocking mounting unit 5 described later is mounted. The mounting hole 43 is formed at a position opposed to a screw hole formed in the first rear cover 30. One of the exterior fixing screws 32 is threaded into the screw hole to fix the first rear cover 30 to the housing 20.

Because of the required maintenance and replacement of the circuit board 40, the electronic circuit unit 4 is, in many cases, disposed on the rear surface side of the image forming apparatus main body 2 so as to enhance maintainability. In this embodiment, the electronic circuit unit 4 is disposed on a back side of the first rear cover 30 so that maintenance or the like can promptly be started when the first rear cover 30 is removed. In this case, as described above, the first rear cover 30 needs to be fixed to the housing 20 of the image forming apparatus main body 2 at multiple positions, and may therefore be fixed in the vicinity of the electronic circuit unit 4 or fixed directly to the shield member 41 or the circuit cover 42. Therefore, it is necessary to take measures against static electricity flowing via the exterior fixing screws 32.

In this embodiment, as illustrated in FIGS. 2 and 3, the static-electricity-blocking mounting unit 5 configured to fix the first rear cover 30 to the circuit cover 42 is mounted to the circuit cover 42. The static-electricity-blocking mounting unit 5 is mounted into the mounting hole 43 formed in the circuit cover 42, and fixes the first rear cover 30 to the housing 20 in a state in which the exterior fixing screw 32 configured to fix the first rear cover 30 to the housing 20 is insulated. Hereinafter, the static-electricity-blocking mounting unit 5 will be specifically described with reference to FIGS. 4 to 8D.

Figure 4:
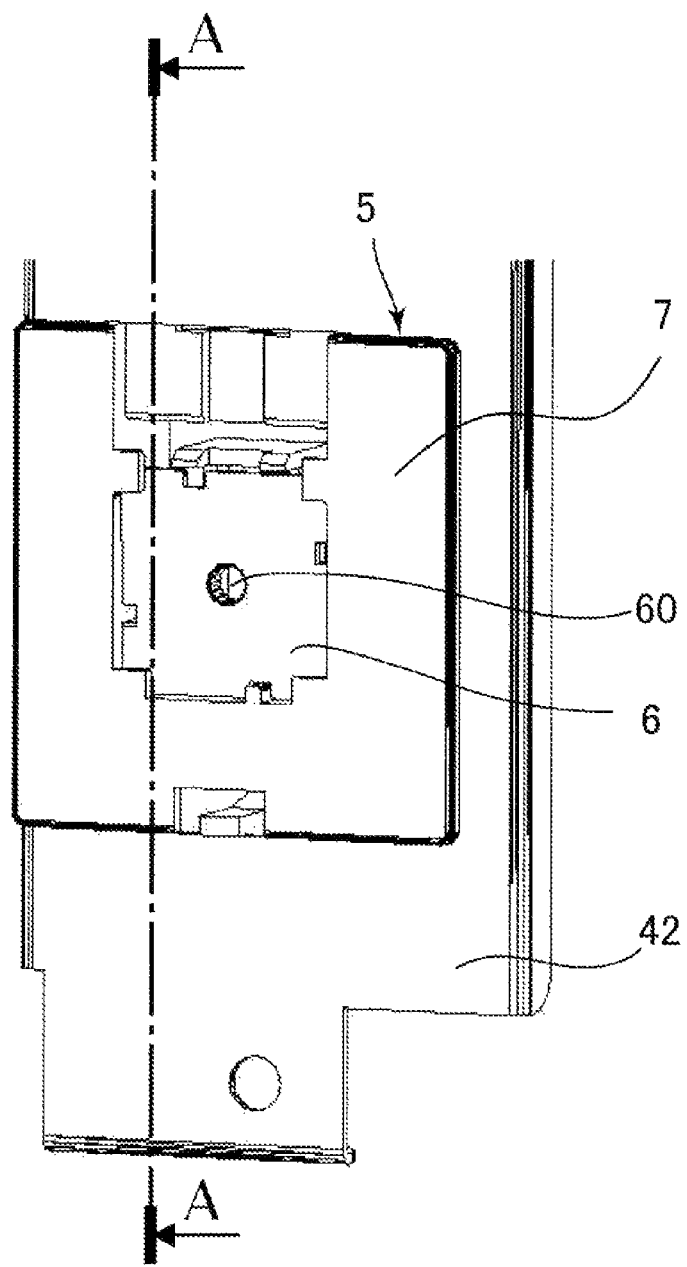
FIG. 4 is a perspective view illustrating a static-electricity-blocking mounting unit mounted to the electronic circuit unit disposed on the rear surface of the image forming apparatus, which is illustrated in FIG. 3.
Figure 5:
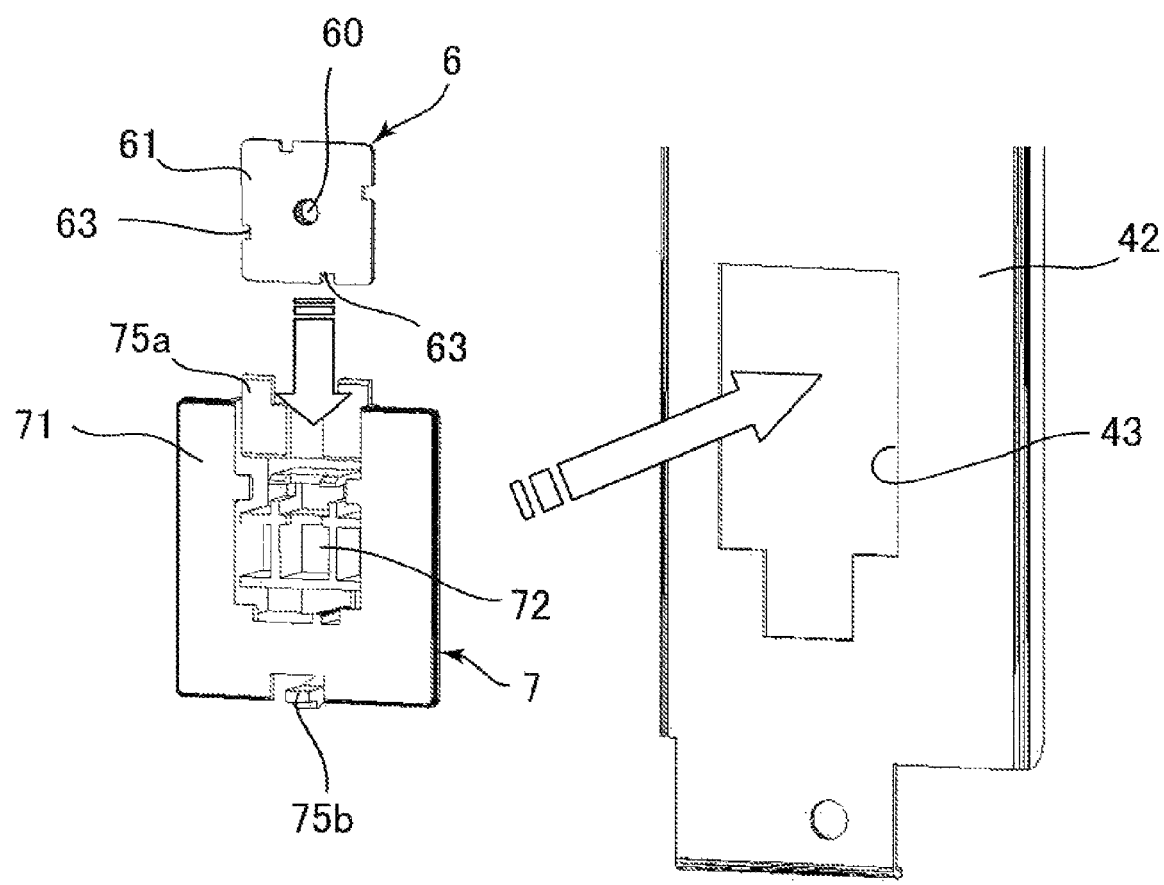
FIG. 5 is a view illustrating a state in which an exterior fixing sheet metal is mounted to a static-electricity-blocking member.
Figure 6:
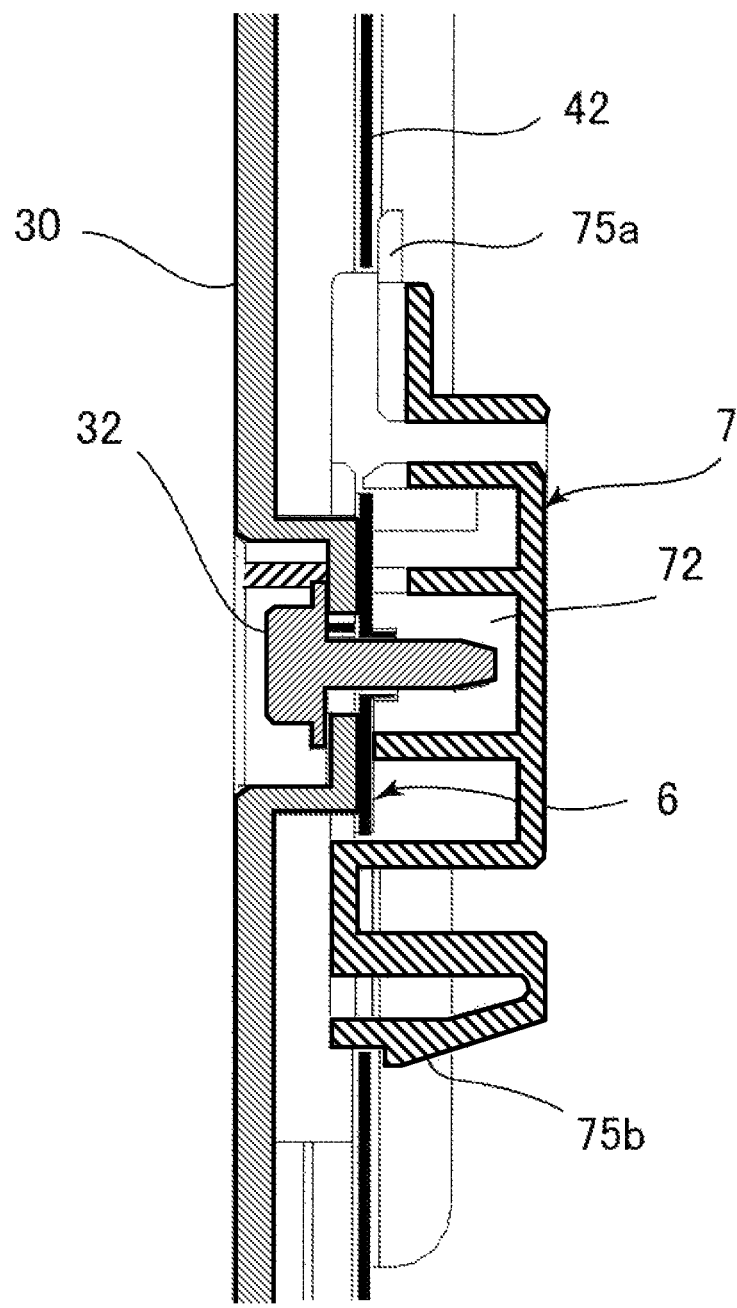
FIG. 6 is a sectional view of the static-electricity-blocking mounting unit in a state in which the static-electricity-blocking mounting unit is mounted into a mounting hole formed in a circuit cover.
Figure 7A:
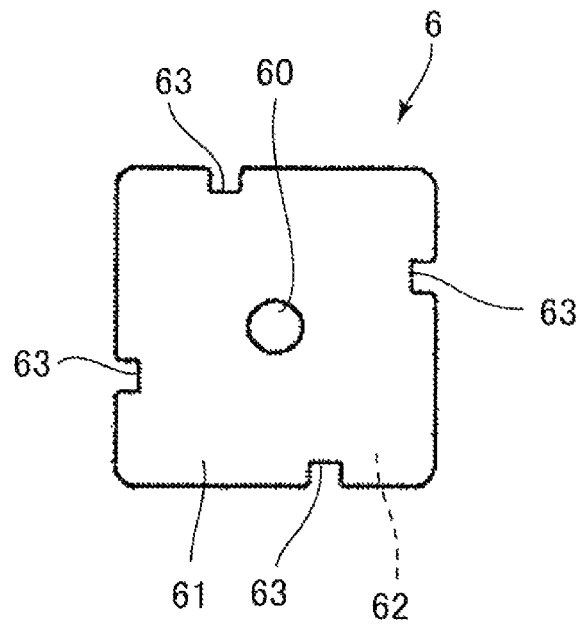
FIG. 7A is a front view of the exterior fixing sheet metal.
Figure 7B:
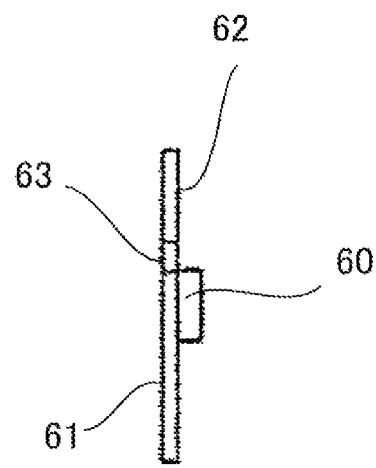
FIG. 7B is a side view of the exterior fixing sheet metal.
Figure 8A:
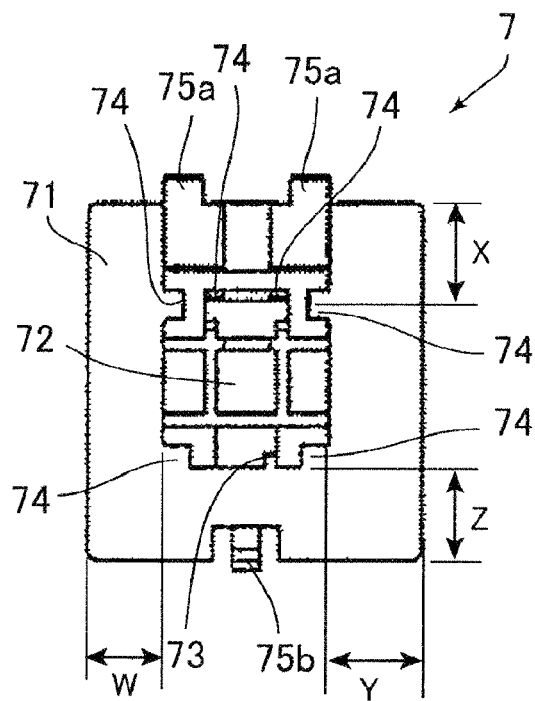
FIG. 8A is a front view of the static-electricity-blocking member.
Figure 8B:
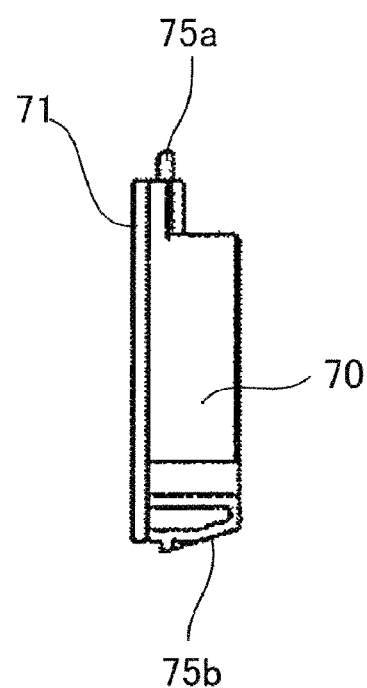
FIG. 8B is a side view of the static-electricity-blocking member.
Figure 8C:
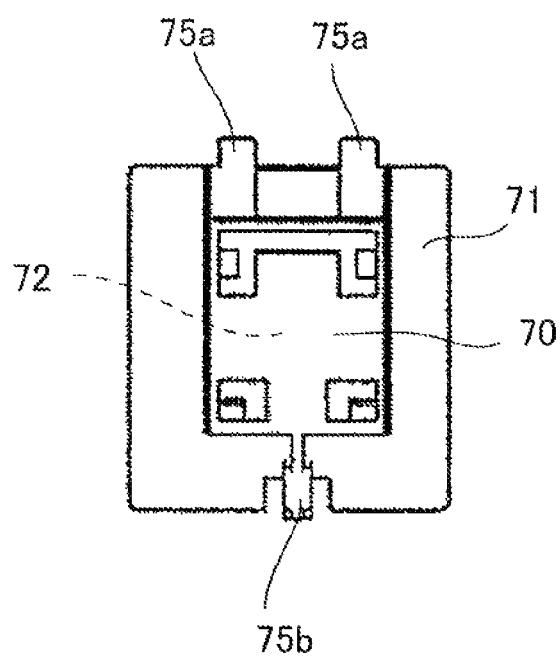
FIG. 8C is a rear view of the static-electricity-blocking member.
Figure 8D:
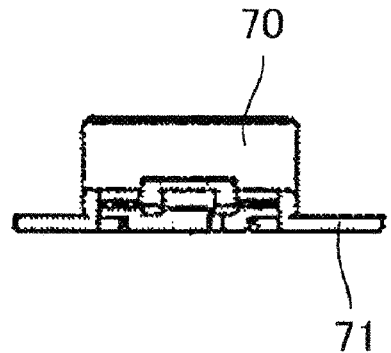
FIG. 8D is a bottom view of the static-electricity-blocking member.

FIG. 4 is a perspective view illustrating the static-electricity-blocking mounting unit 5 mounted to the electronic circuit unit 4 disposed on the rear surface of the image forming apparatus 1, which is illustrated in FIG. 3. FIG. 5 is a view illustrating a state in which an exterior fixing sheet metal 6 serving as a mounting sheet metal is mounted to a static-electricity-blocking member 7 serving as an insulating member. FIG. 6 is a sectional view of the static-electricity-blocking mounting unit 5 in a state in which the static-electricity-blocking mounting unit 5 is mounted into the mounting hole 43 formed in the circuit cover 42. FIG. 7A is a front view of the exterior fixing sheet metal 6. FIG. 7B is a side view of the exterior fixing sheet metal 6. FIG. 8A is a front view of the static-electricity-blocking member 7. FIG. 8B is a side view of the static-electricity-blocking member 7. FIG. 8C is a rear view of the static-electricity-blocking member 7. FIG. 8D is a bottom view of the static-electricity-blocking member 7.

As illustrated in FIGS. 4 to 6, the static-electricity-blocking mounting unit 5 is removably fixed into the mounting hole 43 formed in the circuit cover 42 by a snap fit structure, and includes the exterior fixing sheet metal 6 serving as the mounting sheet metal, and the static-electricity-blocking member 7 serving as the insulating member made of an insulating material.

As illustrated in FIGS. 7A and 7B, the exterior fixing sheet metal 6 is a metal plate formed into a square shape, and at a center portion thereof, a female screw portion 60 is formed for thread engagement of the exterior fixing screw 32 therewith. The female screw portion 60 is formed so that the exterior fixing screw 32 threadably engages with the female screw portion 60 in a direction from a first surface (front surface) 61 side of the exterior fixing sheet metal 6 toward a second surface (back surface) 62 side thereof. Further, at each of four outer edges of the exterior fixing sheet metal 6, there is formed an engaging depression portion 63 engageable with an engaging projection portion 73 described later, which is formed on the static-electricity-blocking member 7. The engaging depression portion 63 is formed at a position slightly shifted from the center of each outer edge. That is, the engaging depression portions 63 are formed so as to be asymmetric on both sides across the center of the exterior fixing sheet metal 6, and hence, as described later, to prevent the exterior fixing sheet metal 6 from being erroneously mounted in a state in which the front and back surfaces thereof are reversed.

As illustrated in FIGS. 8A to 8D, the static-electricity-blocking member 7 includes a main body portion 70 configured to support the outer edges of the exterior fixing sheet metal 6, an extending portion 71 extended from the main body portion 70, and a locking portion 75 configured to lock with the mounting hole 43 formed in the circuit cover 42.

The main body portion 70 is formed into a rectangular box shape, and includes an accommodating portion 72 configured to accommodate a male screw portion 32a of the exterior fixing screw 32 threadably engaged in a direction from the first surface 61 side (first rear cover side) of the exterior fixing sheet metal 6. The accommodating portion 72 is sealed so that a distal end of the male screw portion 32a of the exterior fixing screw 32 is not exposed. That is, the accommodating portion 72 is sealed so that the distal end of the male screw portion 32a is not exposed on the circuit board 40 side (housing 20 side) when the static-electricity-blocking member 7 is mounted into the mounting hole 43. Accordingly, even in a test conducted conforming to the basic standards for electrostatic discharge testing and the immunity standards, the static electricity does not flow from the distal end of the exterior fixing screw 32 configured to fix the first rear cover 30 directly to the exterior fixing sheet metal 6 or the circuit board 40.

Further, the main body portion 70 has the engaging projection portion 73 formed thereon as an interference portion engageable with the engaging depression portion 63 of the exterior fixing sheet metal 6 so that the exterior fixing sheet metal 6 is mountable only in a state in which the first surface 61 is exposed when the exterior fixing sheet metal 6 is supported by the main body portion. The engaging projection portion 73 is formed so as to be engageable with the engaging depression portion 63 only when the exterior fixing sheet metal 6 is mounted in a state in which the first surface 61 is exposed. When the exterior fixing sheet metal 6 is to be mounted in a state in which the second surface 62 is exposed, the engaging projection portion 73 hits against and interferes with the outer edge of the exterior fixing sheet metal 6, and hence the exterior fixing sheet metal 6 cannot be supported. That is, with the engaging projection portion 73, the main body portion 70 regulates a mounting direction of the exterior fixing sheet metal 6, to thereby prevent the exterior fixing sheet metal 6 from being erroneously mounted in a state in which the front and back surfaces thereof are reversed.

Further, support portions 74 configured to support the outer edges of the exterior fixing sheet metal are formed on the main body portion 70. The support portions 74 are formed so as to support the exterior fixing sheet metal 6 by locking the outer edges of the exterior fixing sheet metal 6 only when the engaging projection portion 73 engages with the engaging depression portion 63.

The extending portion 71 is formed substantially in parallel to the exterior fixing sheet metal 6 in the case where the exterior fixing sheet metal 6 is mounted to the support portions 74 of the main body portion 70, and is formed so that outer edges thereof are situated at positions spaced apart from the outer edges of the exterior fixing sheet metal 6 by predetermined distances (W, X, Y, and Z of FIG. 8A).

In this case, as described above, the static-electricity-blocking mounting unit 5 needs to insulate the exterior fixing screw 32 configured to fix the first rear cover 30 to the housing 20. Therefore, it is necessary to comply with the requirements defined by the standards for external static electricity, such as the basic standards for electrostatic discharge testing (IEC 61000-4-2) and the immunity standards (CISPR 24/EN 55024). Accordingly, in this embodiment, as the predetermined distances W, X, Y, and Z of the extending portion 71, approximately 10 mm are ensured. The distance of approximately 10 mm is defined as a distance in which, in a test conducted conforming to the basic standards for electrostatic discharge testing and the immunity standards, the static electricity cannot be discharged from the exterior fixing sheet metal 6 to the circuit cover 42. That is, the predetermined distances W, X, Y, and Z are each defined as a distance in which the static electricity cannot be discharged from the exterior fixing sheet metal 6 to the circuit cover 42, and the extending portion 71 is formed so that the distances from the outer edges of the exterior fixing sheet metal 6 become the predetermined distances W, X, Y, and Z. Note that, as long as the distances from the outer edges of the exterior fixing sheet metal 6 satisfy the predetermined distances W, X, Y, and Z when the outer shape of the exterior fixing sheet metal 6 is downsized or the outer shape of the main body portion 70 is upsized, the extending portion 71 may be omitted.

The locking portion 75 includes engagement portions 75a engageable with an outer edge portion of the mounting hole 43 formed in the circuit cover 42, and an engagement claw (snap fit) 75b engageable with an outer edge portion of the mounting hole 43, which is opposite to the outer edge portion for engagement of the engagement portions 75a. The static-electricity-blocking member 7 is removably mounted to the circuit cover 42 when the engagement claw (snap fit) 75b is engaged with the mounting hole 43 in a state in which the engagement portions 75a are engaged with the outer edge portion of the mounting hole 43.

Note that, as the insulating material (resin) forming the static-electricity-blocking member 7, a thermoplastic resin may be used, and as the thermoplastic resin, for example, a polycarbonate (PC) resin, an ABS resin, or the like may be used.

According to the image forming apparatus 1 of the first embodiment having the above-mentioned structure, the following effects are produced. The image forming apparatus 1 of the first embodiment includes the static-electricity-blocking mounting unit 5 configured to mount the first rear cover 30 to the housing 20 in a state in which the exterior fixing screw 32 is insulated. Therefore, for example, even when the static electricity flows through the exterior fixing screw 32, the static-electricity-blocking mounting unit 5 blocks the static electricity, and hence the static electricity can be prevented from flowing through the circuit board 40. Accordingly, it is possible to prevent the circuit board from malfunctioning or being damaged.

Further, the conventional metallic exterior fixing screw 32 can be used for fixing the rear cover 3, and hence the increase in manufacturing cost can be prevented. Further, no dedicated screw is necessary, and hence it is possible to prevent erroneous assembly at the time of mounting due to mischoice between the dedicated screw and the general metallic screw.

Further, the female screw portion 60 into which the metallic exterior fixing screw 32 is threaded is formed in the metallic exterior fixing sheet metal 6, and hence it is possible to endure repeated fastening and unfastening of the exterior fixing screw 32, and to manufacture the static-electricity-blocking mounting unit 5 at low cost.

Further, as long as a space can be ensured in the circuit cover or the like so as to form the mounting hole 43 into which the static-electricity-blocking member 7 is mountable, the static-electricity-blocking mounting unit 5 can be used at any position that requires measures against static electricity due to the use of the metallic exterior fixing screw 32.

Further, no element for electrostatic measures needs to be added separately, and hence there is no need to take measures, such as circuit modification, with the result that efficiency decrease and cost increase can be suppressed.

Second Embodiment

Figure 9:
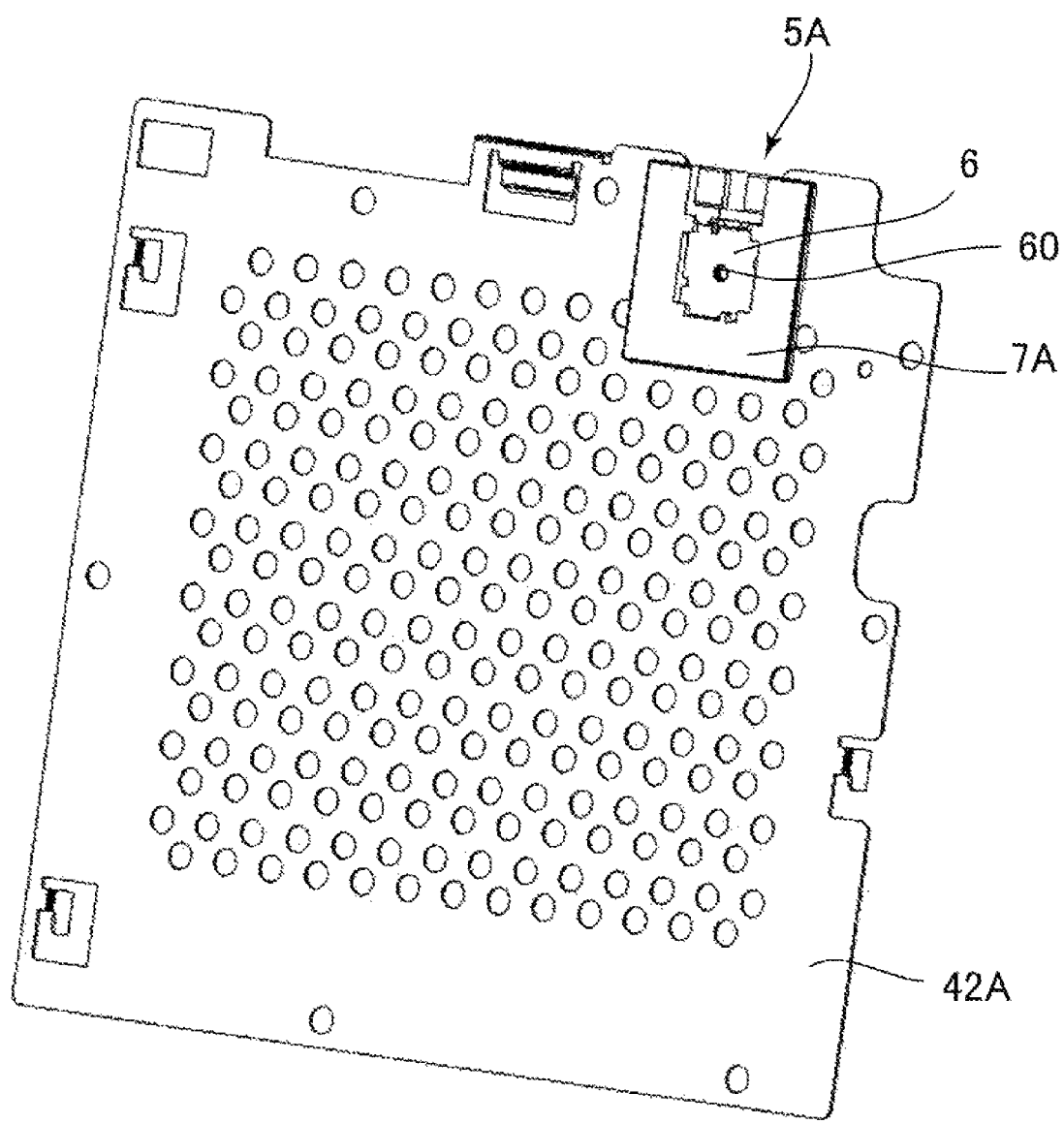
FIG. 9 is a perspective view illustrating a static-electricity-blocking mounting unit mounted to a circuit cover of an electronic circuit unit according to a second embodiment of the present invention.

Next, an image forming apparatus 1A according to a second embodiment of the present invention will be described with reference to FIGS. 9 to 11B as well as FIGS. 1 and 2. The image forming apparatus 1A according to the second embodiment is different from the image forming apparatus 1 according to the first embodiment in the shape of the static-electricity-blocking member of the static-electricity-blocking mounting unit. Therefore, in the second embodiment, the difference from the first embodiment, that is, a static-electricity-blocking mounting unit 5A will be mainly described. Note that, in the second embodiment, the same components as those of the image forming apparatus 1 according to the first embodiment are represented by the same reference symbols, and description thereof is therefore omitted herein. Further, in the second embodiment, the same components as those in the first embodiment produce the same effects as those in the first embodiment. FIG. 9 is a perspective view illustrating the static-electricity-blocking mounting unit 5A mounted to a circuit cover 42A of an electronic circuit unit 4A according to the second embodiment of the present invention.

As illustrated in FIGS. 1 and 2, the image forming apparatus 1A according to the second embodiment includes the image forming apparatus main body 2, the rear cover 3 configured to cover the rear surface of the image forming apparatus main body 2, and the electronic circuit unit 4A disposed on the rear surface of the image forming apparatus main body 2. The electronic circuit unit 4A includes the circuit board 40, the shield member 41, and the circuit cover 42A. As illustrated in FIG. 9, the circuit cover 42A is formed into a rectangular plate shape, and is fixed to the shield member 41 in a state in which the circuit cover 42A is arranged so as to be opposed to the circuit board 40. Further, the circuit cover 42A includes a mounting portion 43A formed by cutting out an outer edge thereof (see FIG. 11A for later reference), and the static-electricity-blocking mounting unit 5A is to be mounted into the mounting portion 43A.

Figure 10A:
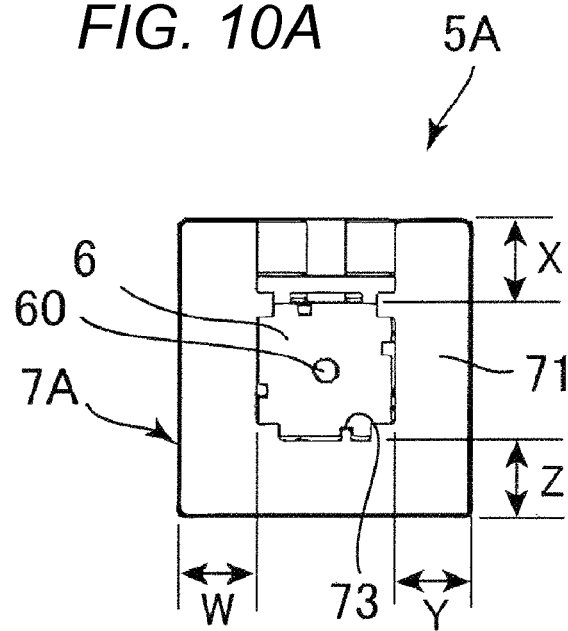
FIG. 10A is a front view of the static-electricity-blocking mounting unit.
Figure 10B:
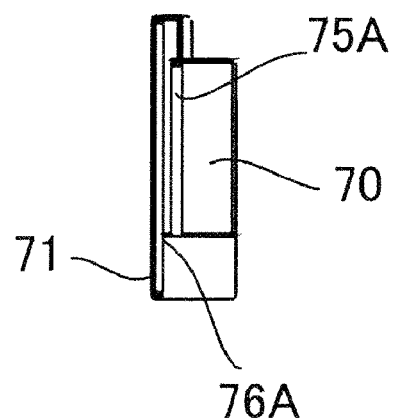
FIG. 10B is a side view of the static-electricity-blocking mounting unit.
Figure 10C:
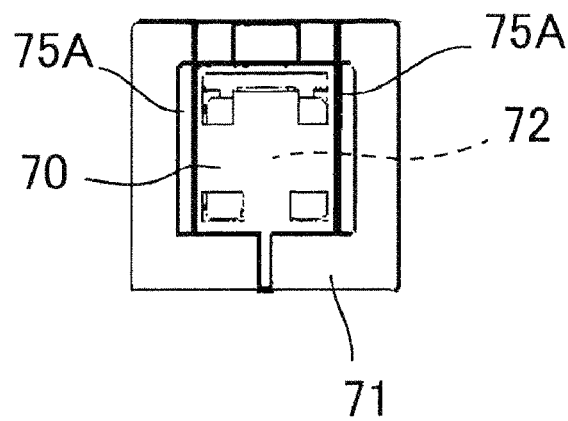
FIG. 10C is a rear view of the static-electricity-blocking mounting unit.
Figure 10D:
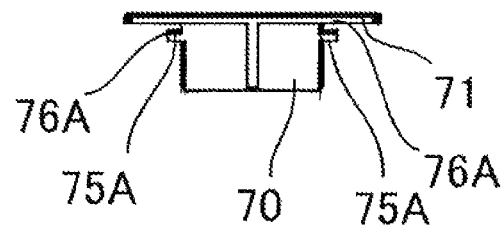
FIG. 10D is a bottom view of the static-electricity-blocking mounting unit.
Figure 11A:
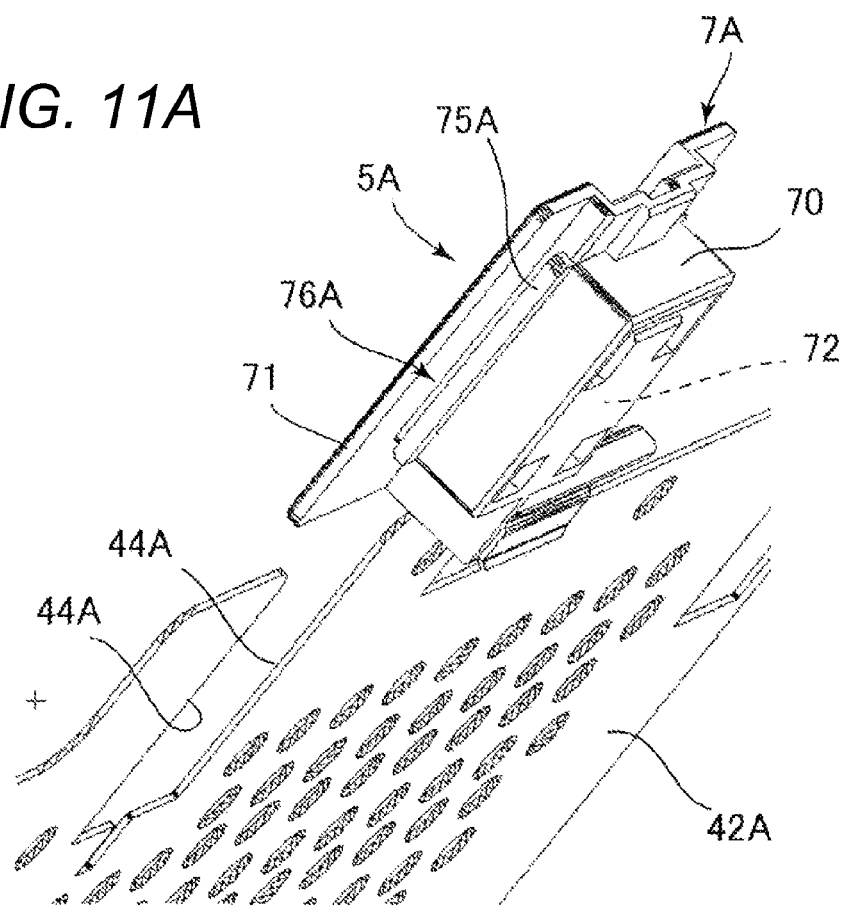
FIG. 11A is a perspective view illustrating a state in which the static-electricity-blocking mounting unit is to be mounted to the circuit cover.
Figure 11B:
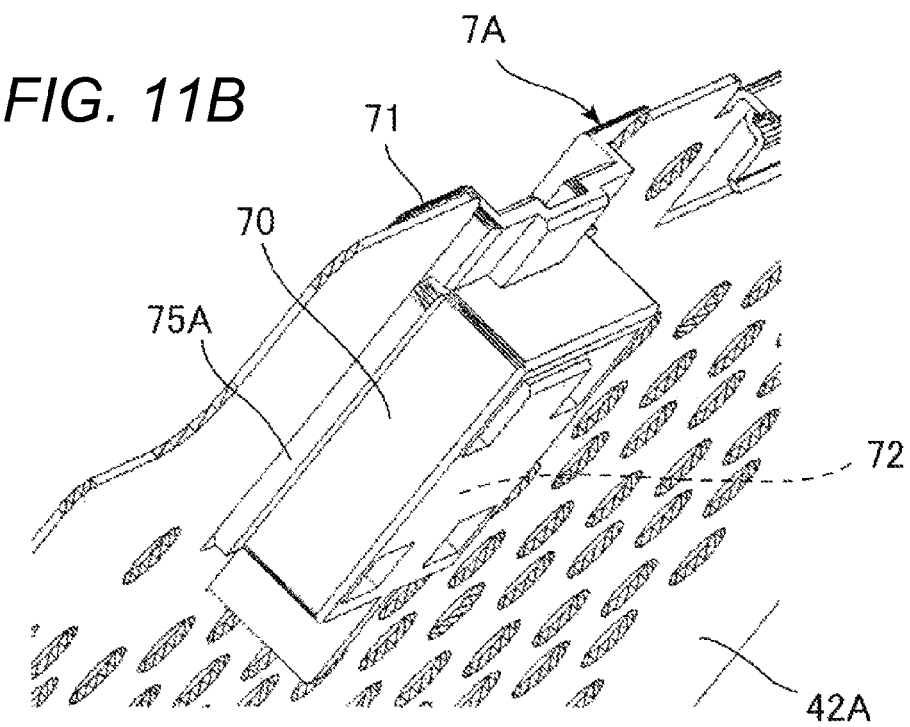
FIG. 11B is a perspective view illustrating a state in which the static-electricity-blocking mounting unit is mounted to the circuit cover.

Next, the static-electricity-blocking mounting unit 5A according to the second embodiment will be described with reference to FIGS. 10A to 11B. FIG. 10A is a front view of the static-electricity-blocking mounting unit 5A. FIG. 10B is a side view of the static-electricity-blocking mounting unit 5A. FIG. 10C is a rear view of the static-electricity-blocking mounting unit 5A. FIG. 10D is a bottom view of the static-electricity-blocking mounting unit 5A. FIG. 11A is a perspective view illustrating a state in which the static-electricity-blocking mounting unit 5A is to be mounted to the circuit cover 42A. FIG. 11B is a perspective view illustrating a state in which the static-electricity-blocking mounting unit 5A is mounted to the circuit cover 42A.

As illustrated in FIGS. 10A to 10D, the static-electricity-blocking mounting unit 5A includes the exterior fixing sheet metal 6 and a static-electricity-blocking member 7A. The static-electricity-blocking member 7A includes the main body portion 70, the extending portion 71, and engagement portions 75A engageable with outer edge portions 44A of the mounting portion 43A formed in the circuit cover 42A. The engagement portions 75A are extended from the main body portion 70 substantially in parallel to the extending portion 71, and form slide grooves 76A between the engagement portions 75A and the extending portion 71. The slide grooves 76A are each configured to insert the outer edge portions 44A of the mounting portion 43A into the slide grooves 76A.

As illustrated in FIGS. 11A and 11B, the static-electricity-blocking mounting unit 5A is mounted in such a manner that the slide grooves 76A formed of the extending portion 71 and the engagement portions 75A are caused to slide along the outer edge portions 44A of the mounting portion 43A of the circuit cover 42A. When the circuit cover 42A is then fixed to the shield member 41, the static-electricity-blocking mounting unit 5A mounted to the circuit cover 42A is fixed.

According to the static-electricity-blocking mounting unit 5A of the image forming apparatus 1A of the second embodiment having the above-mentioned structure, the following effects are produced in addition to the effects of the first embodiment. The static-electricity-blocking mounting unit 5A of the second embodiment is mounted by sliding into the circuit cover 42A. Therefore, for example, when the static-electricity-blocking mounting unit 5A is to be mounted in the vicinity of the outer edge of the circuit cover 42A, the mounting hole 43 does not need to be formed, but alternatively the cut-out mounting portion 43A is formed so that the static-electricity-blocking mounting unit 5A can be mounted. Further, for example, the engagement claw 75b does not need to be provided, and hence the static-electricity-blocking mounting unit 5A can be formed with a simple structure.

Third Embodiment

Figure 12:
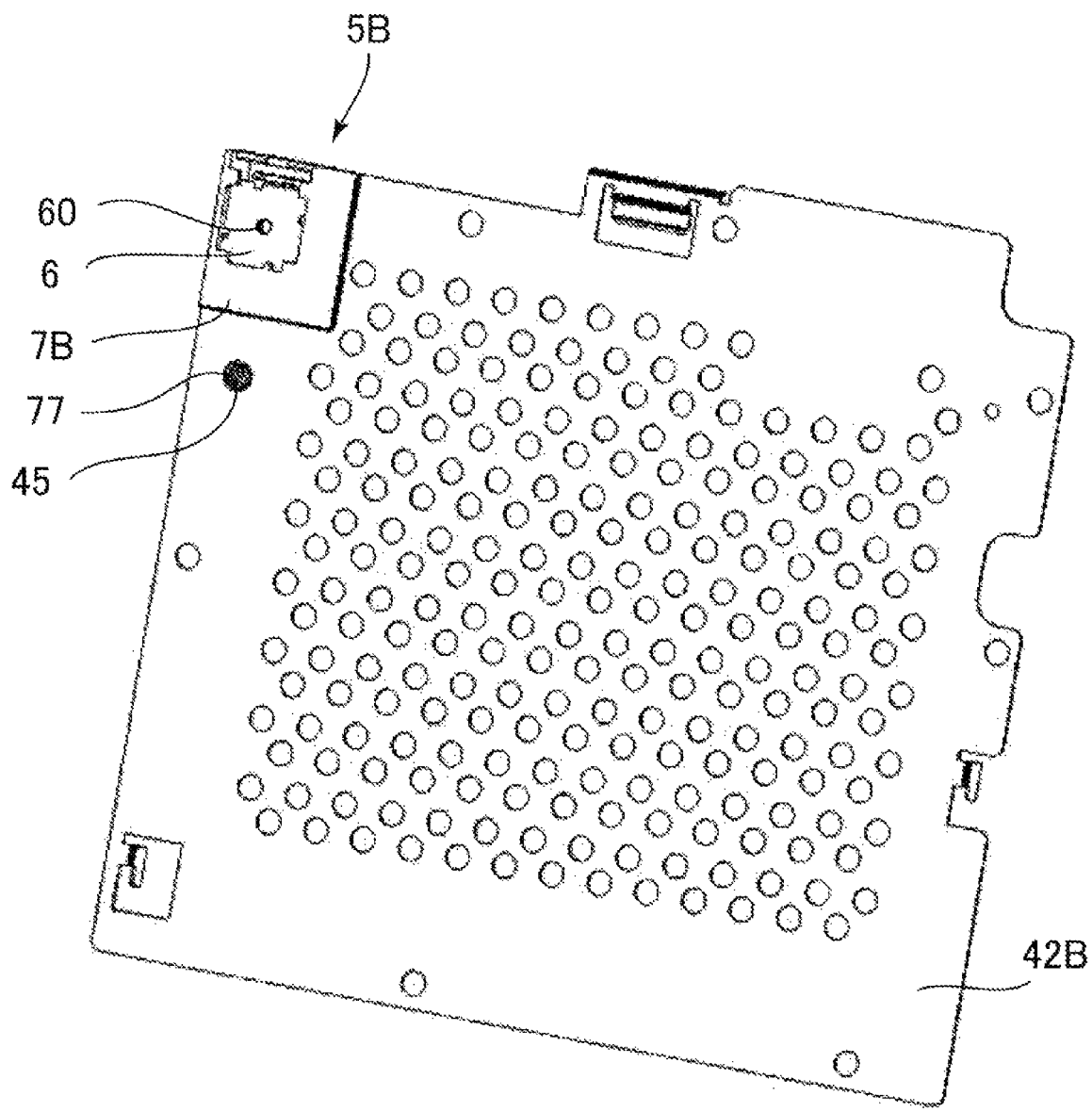
FIG. 12 is a perspective view illustrating a static-electricity-blocking mounting unit mounted to a circuit cover of an electronic circuit unit according to a third embodiment of the present invention.

Next, an image forming apparatus 1B according to a third embodiment of the present invention will be described with reference to FIGS. 12 to 14B as well as FIGS. 1 and 2. The image forming apparatus 1B according to the third embodiment is different from the image forming apparatus 1A according to the second embodiment in the shape of the static-electricity-blocking member of the static-electricity-blocking mounting unit. Therefore, in the third embodiment, the difference from the second embodiment, that is, a static-electricity-blocking mounting unit 5B will be mainly described. Note that, in the third embodiment, the same components as those of the image forming apparatus 1 and 1A according to the first and second embodiments are represented by the same reference symbols, and description thereof is therefore omitted herein. Further, in the third embodiment, the same components as those in the first and second embodiments produce the same effects as those in the first and second embodiments. FIG. 12 is a perspective view illustrating the static-electricity-blocking mounting unit 5B mounted to a circuit cover 42B of an electronic circuit unit 4B according to the third embodiment of the present invention.

As illustrated in FIGS. 1 and 2, the image forming apparatus 1B according to the third embodiment includes the image forming apparatus main body 2, the rear cover 3 configured to cover the rear surface of the image forming apparatus main body 2, and the electronic circuit unit 4B disposed on the rear surface of the image forming apparatus main body 2. The electronic circuit unit 4B includes the circuit board 40, the shield member 41, and the circuit cover 42B. As illustrated in FIG. 12, the circuit cover 42B is formed into a rectangular plate shape, and is fixed to the shield member 41 in a state in which the circuit cover 42B is arranged so as to be opposed to the circuit board 40. The circuit cover 42B includes a mounting portion 43B formed by cutting out a corner portion thereof (see FIG. 14A for later reference), and the static-electricity-blocking mounting unit 5B is to be mounted into the mounting portion 43B (see FIG. 14B for later reference).

Figure 13A:
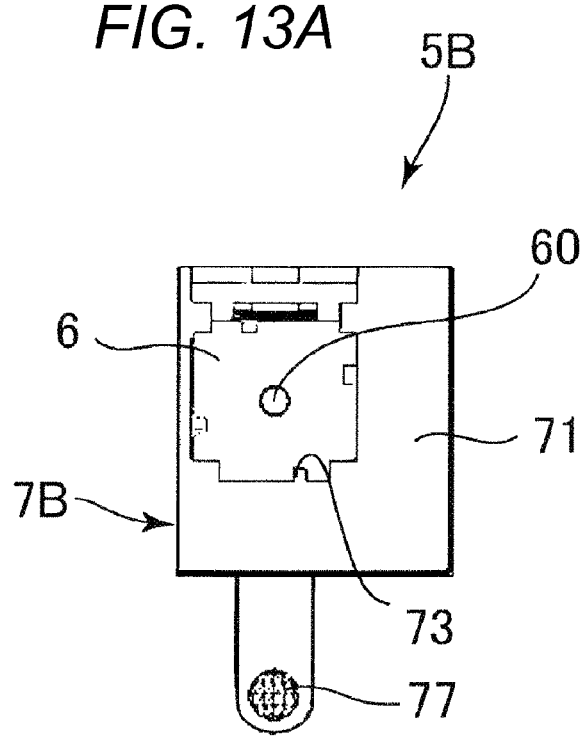
FIG. 13A is a front view of the static-electricity-blocking mounting unit.
Figure 13B:
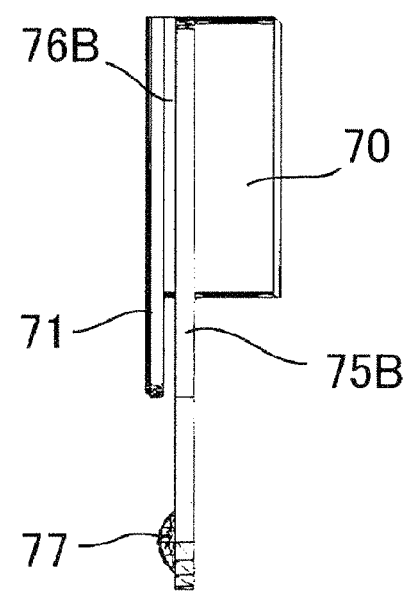
FIG. 13B is a side view of the static-electricity-blocking mounting unit.
Figure 13C:
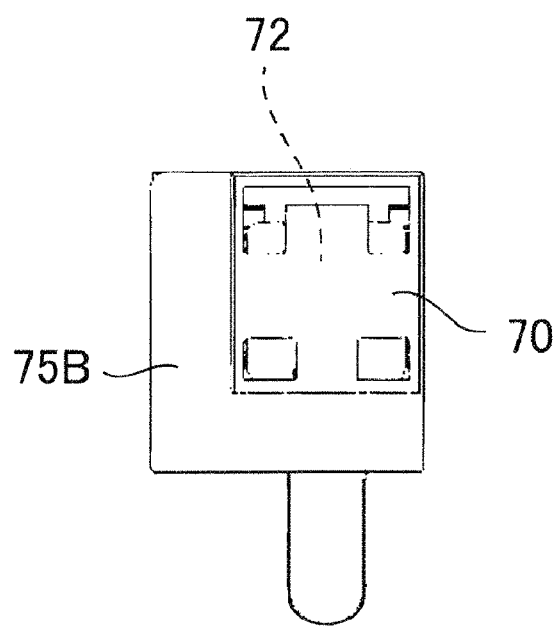
FIG. 13C is a rear view of the static-electricity-blocking mounting unit.
Figure 13D:
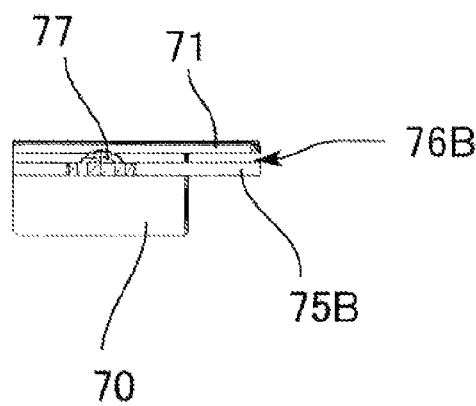
FIG. 13D is a bottom view of the static-electricity-blocking mounting unit.
Figure 14A:
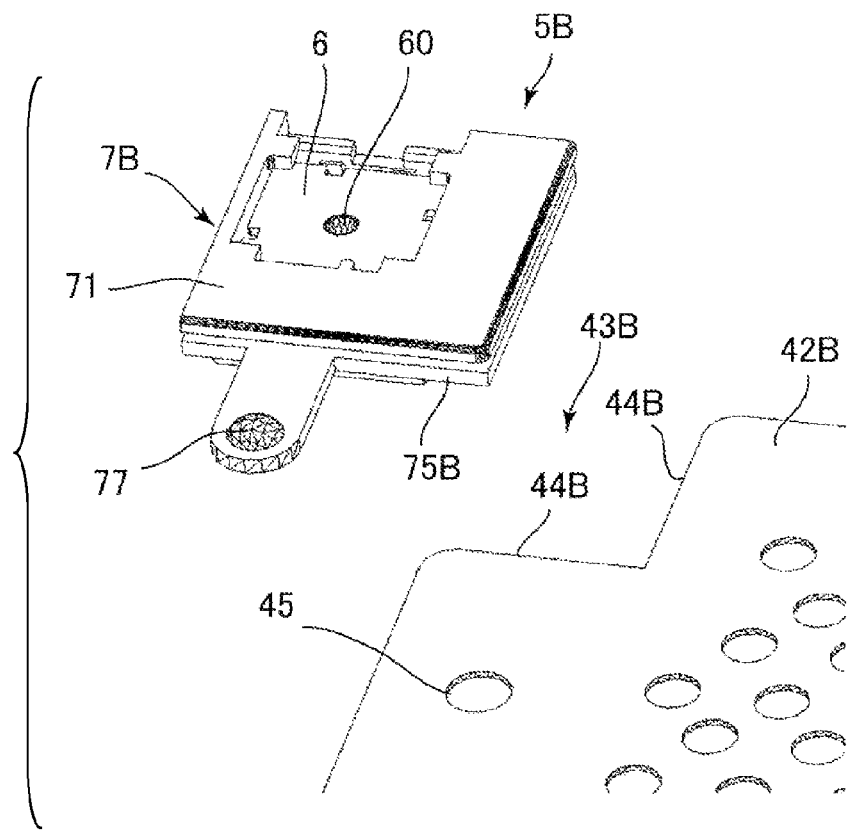
FIG. 14A is a perspective view illustrating a state in which the static-electricity-blocking mounting unit is to be mounted to the circuit cover.
Figure 14B:
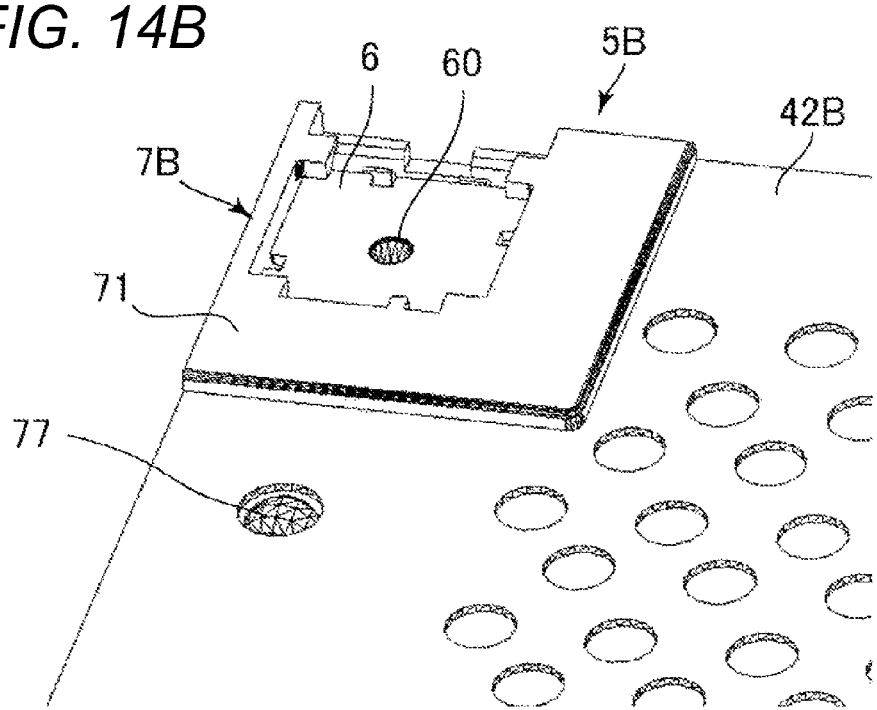
FIG. 14B is a perspective view illustrating a state in which the static-electricity-blocking mounting unit is mounted to the circuit cover.

Next, the static-electricity-blocking mounting unit 5B according to the third embodiment will be specifically described with reference to FIGS. 13A to 14B. FIG. 13A is a front view of the static-electricity-blocking mounting unit 5B. FIG. 13B is a side view of the static-electricity-blocking mounting unit 5B. FIG. 13C is a rear view of the static-electricity-blocking mounting unit 5B. FIG. 13D is a bottom view of the static-electricity-blocking mounting unit 5B. FIG. 14A is a perspective view illustrating a state in which the static-electricity-blocking mounting unit 5B is to be mounted to the circuit cover 42B. FIG. 14B is a perspective view illustrating a state in which the static-electricity-blocking mounting unit 5B is mounted to the circuit cover 42B.

As illustrated in FIGS. 13A to 13D, the static-electricity-blocking mounting unit 5B includes the exterior fixing sheet metal 6 and a static-electricity-blocking member 7B. The static-electricity-blocking member 7B includes the main body portion 70, the extending portion 71, engagement portions 75B engageable with outer edge portions 44B of the mounting portion 43B formed in the circuit cover 42B, and a locking portion 77. The engagement portions 75B are extended from the main body portion 70 substantially in parallel to the extending portion 71, and form slide grooves 76B between the engagement portions 75B and the extending portion 71. The slide grooves 76B are each configured to insert the outer edge portions 44B of the mounting portion 43B into the slide grooves 76B. The locking portion 77 is formed so as to be lockable with a locking hole 45 formed in the circuit cover 42B, and locks the static-electricity-blocking member 7B mounted to the circuit cover 42B along the slide grooves 76B.

As illustrated in FIGS. 14A and 14B, the static-electricity-blocking mounting unit 5B is mounted in such a manner that the outer edge portions 44B of the circuit cover 42B are caused to slide along the slide grooves 76B formed of the extending portion 71 and the engagement portions 75B. When the locking portion 77 is then locked with the locking hole 45, the static-electricity-blocking mounting unit 5B is locked. When the circuit cover 42B is then fixed to the shield member 41, the static-electricity-blocking mounting unit 5B mounted to the circuit cover 42B is fixed.

According to the static-electricity-blocking mounting unit 5B of the image forming apparatus 1B of the third embodiment having the above-mentioned structure, the following effects are produced in addition to the effects produced by structures similar to the image forming apparatus 1 and 1A according to the first and second embodiments. The static-electricity-blocking mounting unit 5B of the third embodiment is mounted by sliding into the circuit cover 42B. Therefore, for example, when the static-electricity-blocking mounting unit 5B is to be mounted in the vicinity of the outer edge of the circuit cover, the mounting hole 43 does not need to be formed, but alternatively the cut-out mounting portion 43B is formed so that the static-electricity-blocking mounting unit 5B can be mounted.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

For example, the embodiments of the present invention are described using the static-electricity-blocking members 7, 7A, and 7B having the rectangular extending portion 71, but the present invention is not limited thereto. The extending portion 71 of the static-electricity-blocking members 7, 7A, and 7B may have a circular shape or an elliptical shape. The extending portion 71 only needs to be formed so that the static electricity cannot be discharged from the exterior fixing sheet metal 6 to the circuit cover 42.

This application claims the benefit of Japanese Patent Application No. 2011-120023, filed May 30, 2011, which is hereby incorporated by reference in its entirety.

What is claimed is:

1. A static-electricity-blocking mounting unit, comprising:
    a mounting sheet metal configured to be fitted to a male screw configured to fix a member to be fixed to a housing; and
    an insulating member made of an insulating material,
    wherein the insulating member comprises an extending portion formed so that the outer edges of the extending portion are situated at positions spaced apart by predetermined distances from the outer edges of the mounting sheet metal,
    wherein the mounting sheet metal is fixed to the housing via the insulating member, and the member is fixed to the housing by the male screw fitted to the mounting sheet metal.

2. A static-electricity-blocking mounting unit according to claim 1, wherein the insulating member comprises a snap fit structure, the snap fit structure being configured to fix the insulating member to an insulating member fixing portion formed in the housing.

3. A static-electricity-blocking mounting unit according to claim 1, wherein the insulating member comprises an accommodating portion configured to accommodate the male screw fitted to the mounting sheet metal.

4. A static-electricity-blocking mounting unit according to claim 1, wherein a female screw portion of the mounting sheet metal is formed so that the male screw is fitted to the female screw portion in a direction from a front surface of the mounting sheet metal toward a back surface of the mounting sheet metal, and
    wherein the insulating member comprises an interference portion which interferes with the mounting sheet metal when the front surface and the back surface of the mounting sheet metal are reversed.

5. An electronic apparatus, comprising:
    a housing in which a circuit board having electronic components mounted thereto is disposed;
    a member to be fixed to the housing with a male screw; and
    a static-electricity-blocking mounting unit as recited in claim 1.

6. A static-electricity-blocking mounting unit, comprising:
    a mounting sheet metal configured to be fitted to a male screw configured to fix a member to be fixed to a housing; and
    an insulating member made of an insulating material,
    wherein the insulating member comprises a snap fit structure, the snap fit structure being configured to fix the insulating member to an insulating member fixing portion formed in the housing,
    wherein the mounting sheet metal is fixed to the housing via the insulating member, and the member is fixed to the housing by the male screw fitted to the mounting sheet metal.

7. A static-electricity-blocking mounting unit, comprising:
    a mounting sheet metal configured to be fitted to a male screw configured to fix a member to be fixed to a housing; and
    an insulating member made of an insulating material,
    wherein the mounting sheet metal is fixed to the housing via the insulating member, and the member is fixed to the housing by the male screw fitted to the mounting sheet metal,
    wherein the insulating member comprises an interference portion which interferes with the mounting sheet metal when the front surface and the back surface of the mounting sheet metal are reversed.

* * * * *